United States Patent
Bohan

(10) Patent No.: US 7,356,424 B2
(45) Date of Patent: Apr. 8, 2008

(54) DIAGNOSTIC COMPILER FOR PIPELINE ANALOG-TO-DIGITAL CONVERTER, METHOD OF COMPILING AND TEST SYSTEM EMPLOYING THE SAME

(75) Inventor: Patrick T. Bohan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 692 days.

(21) Appl. No.: 10/672,609

(22) Filed: Sep. 26, 2003

(65) Prior Publication Data

US 2005/0071829 A1 Mar. 31, 2005

(51) Int. Cl.
*H03M 1/10* (2006.01)
*H03M 1/06* (2006.01)
*H03M 1/00* (2006.01)
*G06F 17/00* (2006.01)

(52) U.S. Cl. .............. 702/86; 341/118; 341/120; 703/2; 703/13; 703/14; 703/17; 714/1

(58) Field of Classification Search ............. 341/118, 341/120, 140; 702/85, 86, 90, 182, 183; 714/1; 717/104; 703/2, 13, 14, 15, 16, 17, 703/19, 20, 21
See application file for complete search history.

(56) References Cited

U.S. PATENT DOCUMENTS

| | | | | |
|---|---|---|---|---|
| 2,839,744 A | * | 6/1958 | Slocomb | 341/140 |
| 3,156,899 A | * | 11/1964 | Reich et al. | 713/401 |
| 3,349,195 A | * | 10/1967 | Gray | 324/537 |
| 3,354,452 A | * | 11/1967 | Irving et al. | 341/140 |
| 5,712,633 A | * | 1/1998 | Bae | 341/120 |
| 5,995,035 A | * | 11/1999 | Signell et al. | 341/163 |
| 6,028,546 A | * | 2/2000 | Signell et al. | 341/161 |
| 6,037,891 A | * | 3/2000 | Griph | 341/161 |
| 6,074,426 A | * | 6/2000 | Baumgartner et al. | 703/13 |
| 6,211,804 B1 | * | 4/2001 | Kaplinsky | 341/120 |
| 6,320,530 B1 | * | 11/2001 | Horie | 341/163 |
| 6,476,741 B1 | * | 11/2002 | Cherubal et al. | 341/120 |
| 6,553,514 B1 | * | 4/2003 | Baumgartner et al. | 714/32 |
| 6,734,818 B2 | * | 5/2004 | Galton | 341/161 |

(Continued)

FOREIGN PATENT DOCUMENTS

JP 58-75920 A * 5/1983

OTHER PUBLICATIONS

Bohan; Modeling converter mismatch, superposition and linearity errors; Engineering Technology, TI Technical Journal; Nov.-Dec. 1996; pp. 1-12.
Bohan; A2D Converter Testing; Texas Instruments, Inc., Revision 1.2; Sep. 2000; pp. 1-132.

*Primary Examiner*—Edward R Cosimano
(74) *Attorney, Agent, or Firm*—J. Dennis Moore; W. James Brady, III; Frederick J. Telecky, Jr.

(57) ABSTRACT

The present invention is directed to a diagnostic compiler for use with a pipeline analog-to-digital converter (ADC) having code sequences corresponding to stages thereof. In one embodiment, the diagnostic compiler includes a transition locator configured to determine transition locations for the code sequences. The diagnostic compiler also includes a characteristics indicator coupled to the transition locator and configured to provide at least one characteristic of the ADC based on the transition locations.

21 Claims, 4 Drawing Sheets

U.S. PATENT DOCUMENTS

| | | | |
|---|---|---|---|
| 7,006,028 B2 * | 2/2006 | Galton | 341/155 |
| 2002/0030615 A1 * | 3/2002 | Cherubal et al. | 341/120 |
| 2002/0041248 A1 * | 4/2002 | Galton | 341/156 |
| 2005/0071829 A1 * | 3/2005 | Bohan | 717/149 |

* cited by examiner

DIAGNOSTIC COMPILER FOR PIPELINE ANALOG-TO-DIGITAL CONVERTER, METHOD OF COMPILING AND TEST SYSTEM EMPLOYING THE SAME

TECHNICAL FIELD OF THE INVENTION

The present invention is directed, in general, to analog-to-digital conversion and, more specifically, to a diagnostic compiler for a pipeline analog-to-digital converter (ADC), a method of compiling and a test system employing the compiler and the method.

BACKGROUND OF THE INVENTION

Analog-to-digital converters (ADCs) contain a mixture of analog and digital circuitry that is used to convert an analog input signal into a digital output word. The accuracy with which the digital output word represents the analog input signal is generally based on the speed, resolution and linearity of the conversion. The conversion speed must be high enough to sample the shortest analog input signal period (highest analog signal frequency) at least twice. The conversion resolution is determined by the number of bits in the digital output word and has to be large enough to resolve the maximum peak-to-peak analog input signal into a required degree of granularity. The conversion linearity has to be sufficient to operate at or preferably below a required maximum level of distortion associated with the conversion process.

Several different algorithms and architectures exist that may be employed to accomplish a conversion. These include successive approximation, sigma-delta, dual slope integrating, flash and pipeline ADCs. Of particular interest is the pipeline ADC, which typically provides a conversion every clock cycle after an initial latency period. The pipeline ADC may also provide a significant conversion resolution (12 or more bits) at high analog signal sampling rates (80 million or more samples per second).

The pipeline ADC employs a pipeline of conversion stages wherein each pipeline stage provides a subset of the total number of overall bits of resolution. Additionally, each pipeline stage typically employs a sample and hold circuit and a residual signal normalizing circuit. The sample and hold circuit employs input and feedback capacitors to track a stage input signal and then hold a particular value while an associated pipeline stage converts it to one or more bits of resolution. A residual analog signal is amplified by the residual signal normalizing circuit and presented as the input signal to the succeeding pipeline stage.

For ideal linearity, an ADC transfer curve would look like a stair case that starts and stops in the correct locations and has steps that are uniform in width and height. A differential non-linearity (DNL) arises when the stair steps (representing particular conversion codes) are not the same widths. These stair widths may be a half-width too wide or too narrow based on a one half least significant bit (LSB) error in the conversion. A DNL also arises when a conversion code is erroneously skipped (a "missing code" where DNL equals −1 LSB) resulting in a double stair width. An integral non-linearity (INL) may be defined as a running summation of these various DNL errors.

The capability to emulate linearity errors is valuable both as design and testing tools. Physical, empirical or "a priori" models may be used to provide this capability. A physical model usually requires the application of engineering judgement to approximate the performance of a device. This makes its application more difficult in all but simple applications. An empirical model typically recjuires the development of statistical data taken from actual devices. To be reliable, this data should be noise-free and taken from as large a sample space as possible. A priori models are usually based on an investigative system employing a mathematical function.

A major transition is defined as a location in a converter design where a discontinuity may arise thereby affecting both DNL and INL directly. For example, the major transitions of a successive approximation ADC are always located in a predictable $2^n$ locations, where n is the number of bits defining its resolution. Rademacher functions are sequential functions that may be employed in an a priori model to provide transition-effect linearity errors associated with successive approximation ADCs. Rademacher functions accomplish this purpose by providing the locations of the major carry transitions associated with the successive approximation algorithm. However, the Rademacher functions are not suited for pipeline ADCs, since their transition locations vary depending on a specific pipeline ADC design.

Accordingly, what is needed in the art is a way to apply an a priori model in ascertaining linearity errors for an ADC having a pipeline structure.

SUMMARY OF THE INVENTION

To address the above-discussed deficiencies of the prior art, the present invention is directed to a diagnostic compiler for use with a pipeline analog-to-digital converter (ADC) having code sequences corresponding to stages thereof. In one embodiment, the diagnostic compiler includes a transition locator configured to determine transition locations for the code sequences. Additionally, the diagnostic compiler also includes a characteristics indicator coupled to the transition locator and configured to provide at least one characteristic of the pipeline ADC based on the transition locations.

In another aspect, the present invention provides a method of diagnostically compiling for use with a pipeline analog-to-digital converter (ADC) having code sequences corresponding to stages thereof. The method includes determining transition locations for the code sequences and providing at least one characteristic of the pipeline ADC based on the transition locations.

The present invention also provides, in yet another aspect, a test system. The test system includes a data processing unit that has a device testing interface, and a pipeline analog-to-digital converter (ADC) that is coupled to the device testing interface and has code sequences corresponding to stages thereof. The test system also includes a diagnostic compiler, coupled to the pipeline ADC, having a transition locator that determines transition locations for the code sequences, and a characteristics indicator, coupled to the transition locator, that provides at least one characteristic of the pipeline ADC based on the transition locations.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
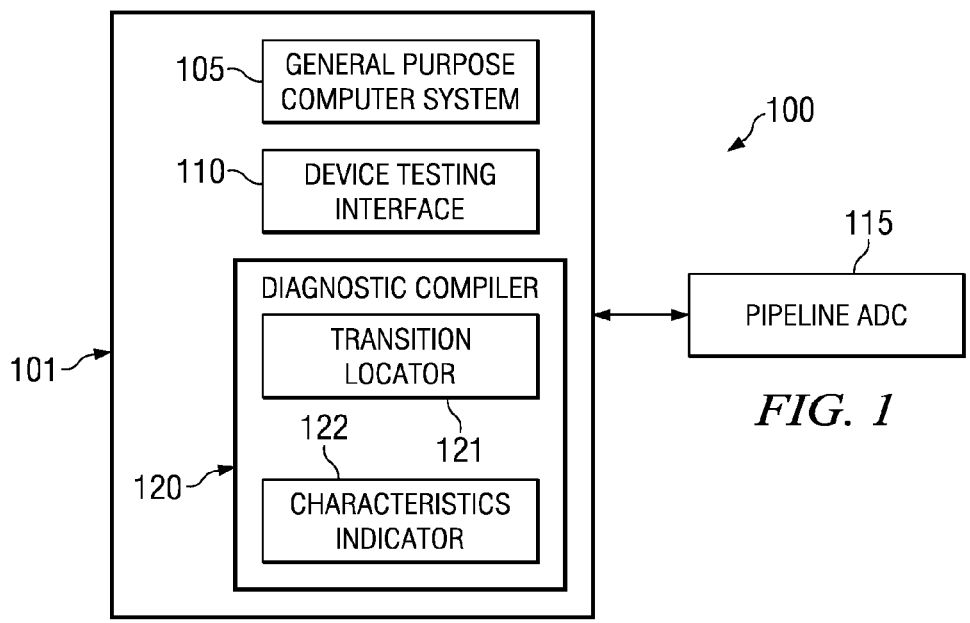
FIG. 1 illustrates a diagram of an embodiment of a test system constructed in accordance with the principles of the present invention.

Referring initially to FIG. 1, illustrated is a diagram of an embodiment of a test system, generally designated 100, constructed in accordance with the principles of the present invention. The test system 100 includes a data processing unit 101 having a general purpose computer system 105 coupled to a device testing interface 110, a pipeline analog-to-digital converter (ADC) 115 coupled to the device testing interface 110 and a diagnostic compiler 120 that is also coupled to the pipeline ADC 115. The diagnostic compiler 120 includes a transition locator 121 and a characteristics indicator 122.

The data processing unit 105 employs the general purpose computer system 105 to control the device testing interface 110 and process test data associated with the pipeline ADC 115. The pipeline ADC 115 employs a plurality of stages that are associated with corresponding code sequences. The general purpose computer system 105 and the device testing interface 110 also cooperate with the diagnostic compiler 120 in testing the pipeline ADC 115. The transition locator 121 determines transition locations for the code sequences, and the characteristics indicator 122, which is coupled to the transition locator 121, provides at least one characteristic of the pipeline ADC based on the transition locations. In the illustrated embodiment, the diagnostic compiler 120 is embodied completely in software. In an alternative embodiment, the diagnostic compiler 120 may employ a combination of hardware and software or be embodied solely in hardware.

In the illustrated embodiment, the pipeline ADC 115 is a 12-bit converter. The design architecture chosen for the 12-bit converter may depend on a specific specification that the converter is trying to optimize or target. For example, if the converter is required to exhibit a high spurious-free dynamic range, an optimal design may dictate a large number of bits in the first stage. This requirement may dictate that the pipeline ADC 115 be constructed using three stages employing four bits per stage. Alternatively, a pipeline converter architecture having six stages consisting of two bits per stage is typically more easily constructed, since the task of component matching may be more easily achieved. The transition locations for each of these example 12-bit pipeline converter architectures is different.

The diagnostic compiler 120 provides an a priori model of the pipeline ADC 115, thereby allowing a shortening of its test sequence in most circumstances. The transition locator 121 employs a mathematical function (as pipeline transition functions herein designated as "Bohan functions") to determine the transition locations of the pipeline ADC 115 based on the number and sizes of its stages. The Bohan functions employ the attributes of orthogonality and bi-state functionality.

The Bohan functions employed in the transition locator 121 determine both the number of transitions and their code locations for each stage of the pipeline ADC 115. Generally for stage m, the number of stage transitions (NST) may be expressed as:

$$NST_m = (2^j - 2) * \sum_{0}^{m-1} (2^j - 2), \quad (1)$$

where j is the number of bits in the stage m. The $NST_m$ as calculated in equation (1) provides the number of integral non-linearity (INL) transitions generated by mismatches in the $m^{th}$ stage of a pipeline ADC even if all stages previous to the $m^{th}$ stage do not have any mismatches. So, a mismatch occurs at the third stage of a stage pipeline ADC employing two bits, 14 INL transitions will be affected as will be further discussed with respect to FIG. 2. The transition locator 121 also provides the specific code locations where these stage transitions occur. Generally for stage m, the location of stage transitions (LST) may be expressed as:

$$LST_m = \frac{N}{2} \pm \frac{N}{2^{m+2}} \pm j * \frac{N}{2^{m+1}}, \quad (2)$$

where $0 \leq j \leq 2^m - 2$, and N denotes $2^n$ for an n-bit converter.

The characteristics indicator 122 provides mismatch characteristics based on the location of a stage transition. Recall that a differential non-linearity (DNL) arises when the stair steps (representing particular conversion codes) are not the same widths, and an INL may be defined as a running summation of these various DNL errors. Several mismatch characteristics affect the INL of the converter.

For example, one of the mismatch characteristics includes an offset error, which may be defined as a bias in the INL toward values that are either higher or lower than ideal. Another mismatch characteristic includes a stage mismatch error, which may be defined as an error arising from one or more of the pipeline converter stages demonstrating an operational variance that contributes significantly to the INL. The stage mismatch error may typically be generated by effects associated with capacitive mismatches, resistive mismatches, and comparative mismatches. A reconstruction error may be defined as a summation of the offset error and the stage mismatch errors. Then, the reconstruction error may be employed along with the INL to determine a superposition error for the pipeline converter. The superposition error may be defined as that portion of the INL that is not generated by offset or stage mismatch errors and typically occurs through common mode contributions from common converter elements. Superposition errors may typically be smaller than mismatch errors in an untrimmed pipeline converter.

Figure 2:
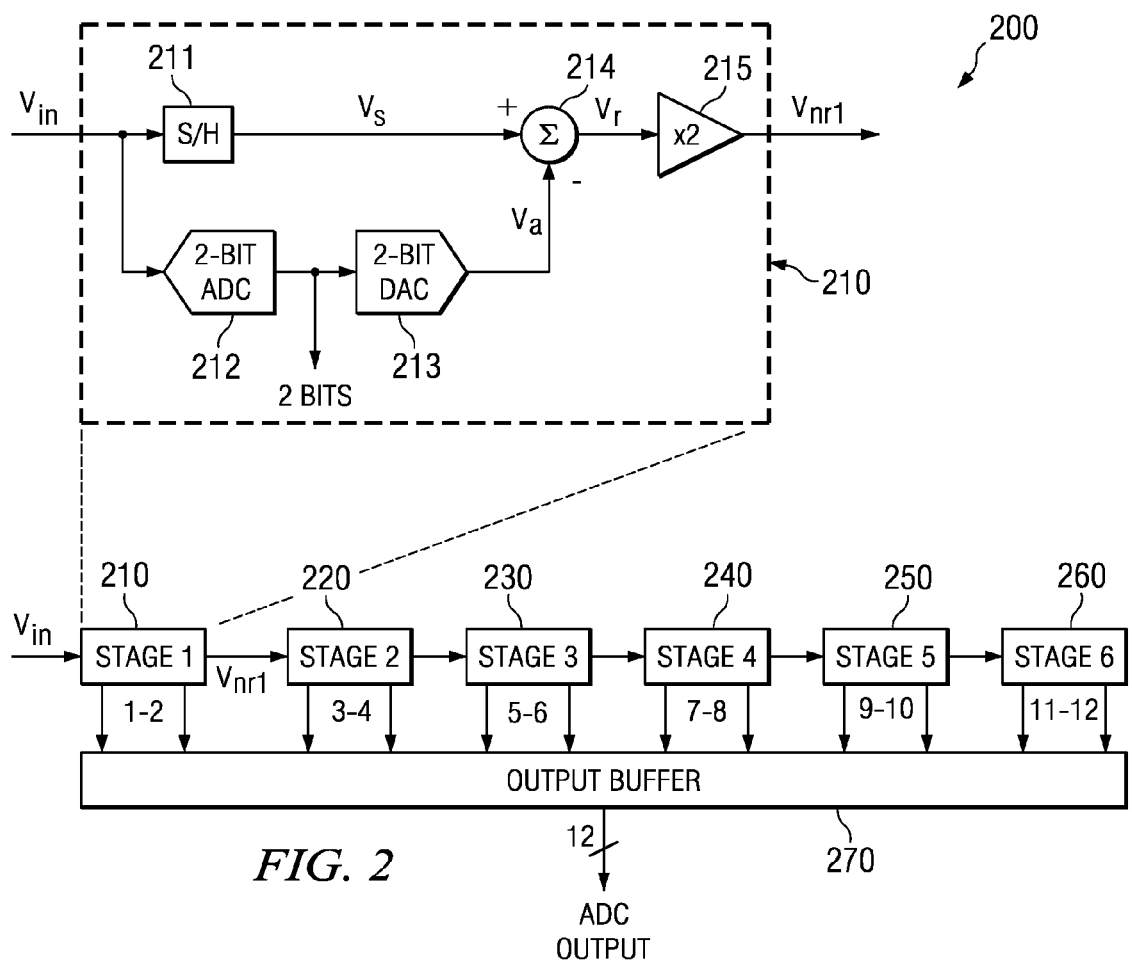
FIG. 2 illustrates a diagram of an embodiment of a 12-bit pipeline ADC that may be employed in the test system of FIG. 1.

Turning now to FIG. 2, illustrated is a diagram of an embodiment of a 12-bit pipeline ADC, generally designated 200, that may be employed in the test system 100 of FIG. 1. The pipeline ADC 200 includes first, second, third, fourth, fifth and sixth stages 210, 220, 230, 240, 250, 260, wherein each stage employs two bits, and an output buffer 270. The first stage 210 receives an ADC input voltage Vin to be digitized and provides a first normalized residual voltage Vnr1 to the second stage 220. The first stage 210 includes a sample and hold circuit (S/H) 211, a 2-bit sub-ADC 212, a 2-bit digital to analog converter (DAC) 213, a summing circuit 214 and a normalizing amplifier 215, which provides the first normalized residual voltage Vnr1.

The S/H 211 tracks the input voltage Vin and provides a sample voltage Vs that is held while the first stage 210 performs its conversion of two bits. The sub-ADC 212 performs a conversion on the input voltage Vin and provides output bits 1-2, which are the most significant bits for the pipeline ADC 200. The DAC 213 converts the output bits 1-2 back to an equivalent analog voltage Va that is subtracted from the sample voltage Vs. This action provides an internal residual voltage Vr to the normalizing amplifier 215. The normalizing amplifier 215 normalizes the internal residual voltage Vr employing an amplifier gain of two to provide the first normalized residue voltage Vnr1 to the second stage 220. Each of the succeeding five stages employs the same nominal components to pipeline remaining normalized residual voltages through the pipeline ADC. The output buffer 270 accumulate the 12 output bits from the pipeline ADC 200 and presents them in parallel as an output word after the sixth stage 260 completes its conversion.

For a stage m of the pipeline ADC 200, equation (1) becomes:

$$NST_m = 2^{(m+1)} - 2 \quad (3)$$

Thus, for stage 1 (i.e., m=1) there are two transitions, for stage 2 there are six transitions, for stage 3 there are 14 transitions, for stage 4 there are 30 transitions, for stage 5 there are 62 transitions and for stage 6 there are 126 transitions.

Similarly, applying equation (2) to the pipeline ADC 200 provides the following transition code locations:
Stage 1: 1536, 2560;
Stage 2: 768, 1280, 1792, 2304, 2816, 3328;
Stage 3: 364, 640, 896, 1152, 1408, 1664, 1920, 2176, 2432, 2688, 2944, 3200, 3456, 3712;
Stage 4: 192, 320, 448, 576, 704, 832, 960, 1088, 1216, 1344, 1472, 1600, 1728, 1856, 1984, 2112, 2240, 2368, 2496, 2624, 2752, 2880, 3008, 3136, 3264, 3392, 3520, 3648, 3776, 3904;
Stage 5: 96, 160, 224, 288, 352, 416, 480, 544, 608, 672, 736, 800, 864, 928, 992, 1056, 1120, 1184, 1248, 1312, 1276, 1440, 1504, 1568, 1632, 1696, 1760, 1824, 1888, 1952 4000; and
Stage 6: 48, 80, 112, 144, 176, 208, 240, 272, 304, 336, 368, 400, 432, 464, 496, 528, 560, 592, 624, 656, 688, 720, 752, 784, 816, 848, 880, 912, 944, 976 . . . 4048.

In the illustrated embodiment, these transition codes designate ADC count locations where discontinuities in the INL may occur. Knowledge of these locations allows a focused effort to improve linearity in a testing or design phase for a particular pipeline ADC implementation.

Figure 3:
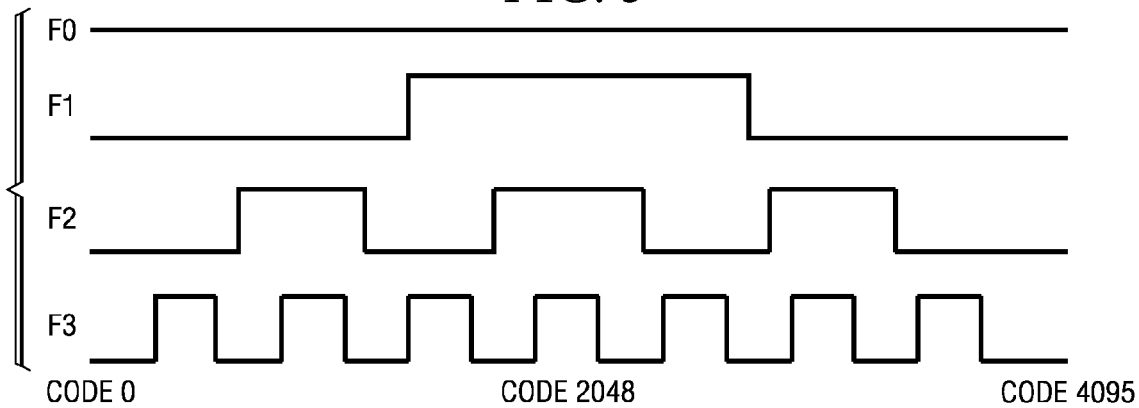
FIG. 3 illustrates waveforms representing Bohan functions associated with the pipeline ADC of FIG. 2.

Turning to FIG. 3, illustrated are waveforms representing Bohan functions, generally designated 300, associated with the pipeline ADC 200 of FIG. 2. For simplicity, only the first four Bohan functions F0, F1, F2, F3 (collectively designated as the Bohan functions F0-F3) are shown in FIG. 3. The Bohan functions F0-F3 are associated with a converter offset error Co and first, second and third stage mismatch errors C1, C2, C3, respectively. Of course, a complete Bohan functions representation of the pipeline ADC 200 also contains the Bohan functions F4-F6, which represent fourth, fifth and sixth stage mismatch errors C4, C5, C6, respectively. The Bohan functions 300 demonstrate the attributes or properties of orthogonality and bi-state functionality. That is, the Bohan functions F0-F3 are independent of one another and exist in one of two states as a function of the ADC codes, which are broadly designated in FIG. 3, as shown.

The converter offset error Co may be expressed as:

$$Co = \frac{1}{N} \sum_{n=0}^{4095} INL_n, \quad (4)$$

where $INL_n$ is the INL error of the $n^{th}$ codeword, and N equals the total number of codewords, which is $2^{12}$ or 4096 for the illustrated embodiment of the 12-bit converter. The converter offset error Co, as expressed in equation (4), is an average of all INL errors and is the offset contribution to mismatch errors represented by the first transition sub-function F0 of FIG. 3.

The stage mismatch error Cm may be expressed as:

$$Cm = \frac{1}{N} \sum_{n=0}^{4095} INL_n (2k_{mn} - 1), \quad (5)$$

where $k_{mn}$ represents the logic value of the $m^{th}$ stage at the $n^{th}$ codeword, and N again equals 4096 for the 12-bit converter. The stage mismatch error Cm, as expressed in equation (5), is the coefficient of the appropriate transition sub-function Fm. Equation (5) provides a coefficient representing the stage mismatch error for each stage of the 12-bit converter. Thus, there are six stage mismatch error coefficients C1, C2, C3, C4, C5, C6, in the illustrated embodiment. The parameter $k_{mn}$ assumes values of a logic one (i.e., 1) or a logic zero (i.e., 0) in equation (5) depending on the state of a particular converter stage, and therefore its corresponding stage sub-transition function Fm, at the codeword n. Then, the value of $(2k_{mn}-1)$ becomes 1 or $-1$ in equation (5) when $k_{mn}$ is 1 or 0, respectively. A particular value of $INL_n$ is thereby added to or subtracted from the overall value of INL as a result of this action.

A reconstructed error $REC_n$ may be expressed as:

$$REC_n = Co + \sum_{m=1}^{12} Cm(2k_{mn} - 1), \quad (6)$$

where the values m, $(2k_{mn}-1)$, Co and Cm are defined as above. The reconstructed error $REC_n$, as expressed in equation (6), is the INL error represented by the converter offset and stage mismatch errors for the $n^{th}$ codeword.

A superposition error $SUPER_n$ may be expressed as:

$$SUPER_n = INL_n - REC_n, \quad (7)$$

where $SUPER_n$ is the superposition error associated with the $n^{th}$ codeword. The superposition error $SUPER_n$, as expressed in equation (7), represents the INL error that is not associated with the converter offset and stage mismatch errors. As discussed previously, the superposition error $SUPER_n$ is caused by effects common to the converter that are independent of a particular stage and is typically smaller than converter offset and stage mismatch errors in an untrimmed pipeline converter.

Figure 4A:
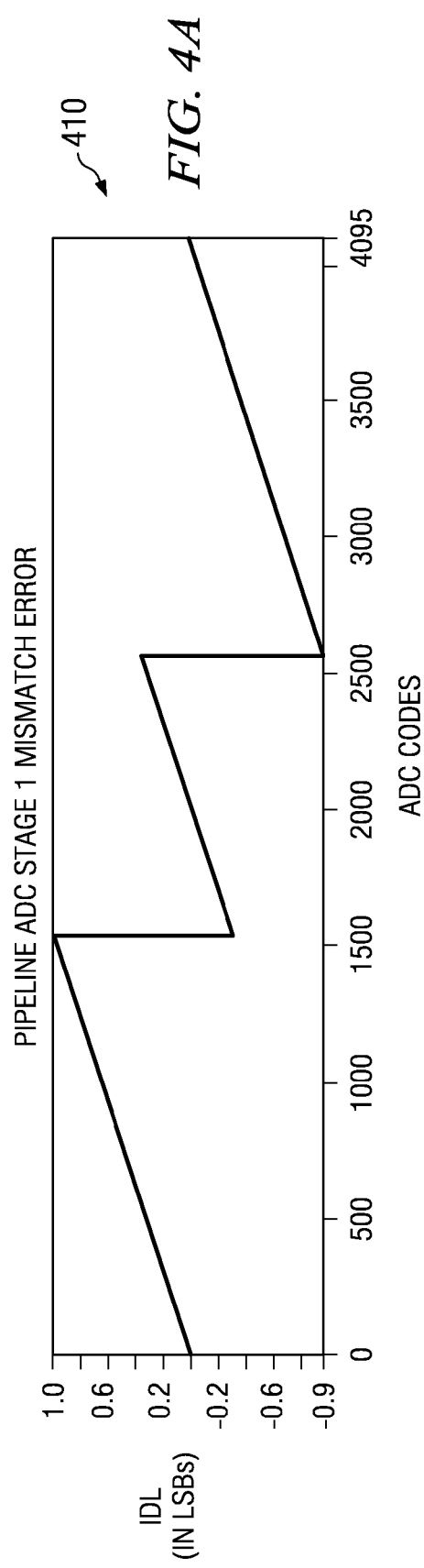
FIGS. 4A, 4B, 4C and 4D illustrate INL plots showing examples of stage mismatch errors associated with a 12-bit pipeline ADC employing two bits per stage.

Turning now to FIGS. 4A, 4B, 4C and 4D, illustrated are INL plots showing examples of stage mismatch errors associated with a 12-bit pipeline ADC employing two bits per stage. FIG. 4A shows an INL plot, generally designated 410, associated with a first stage mismatch error. The INL 410 is characterized in least significant bits (LSBs) of the ADC over a full range of ADC codes (0-4095). As previously discussed, two major transitions may be seen to occur in the INL at ADC codes 1536 and 2560 due to a first stage mismatch error. Overall the INL is seen to vary from +1.0 LSB to −0.9 LSB and may typically be trimmed-out for an existing pipeline ADC. Alternatively, a diagnostic compiler or method of compiling may be employed to select component tolerances that significantly reduce or substantially eliminate first stage mismatch errors for a new pipeline ADC design.

Figure 4B:
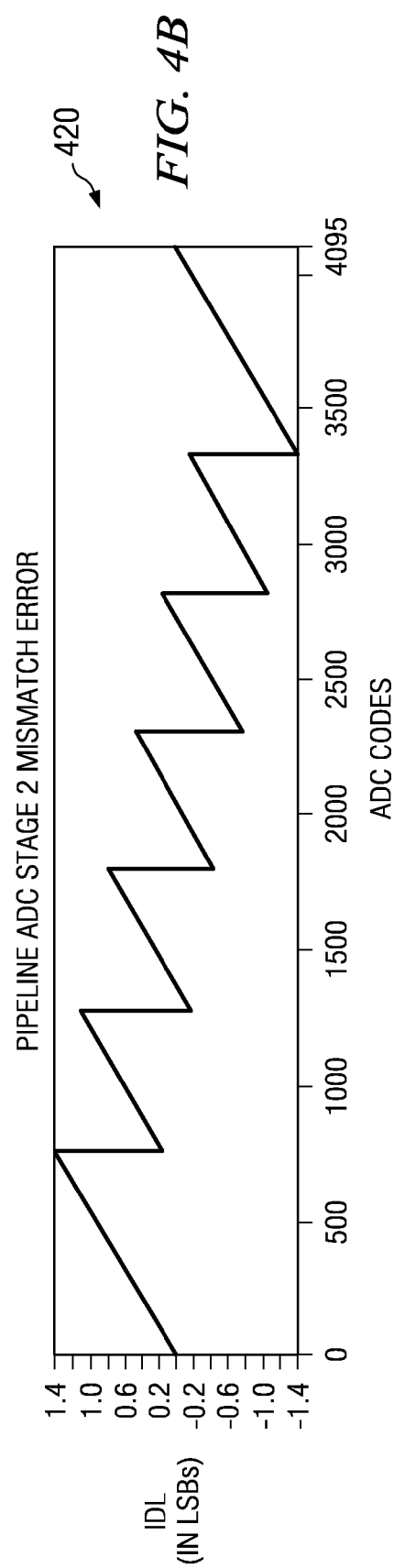
Figure 4C:
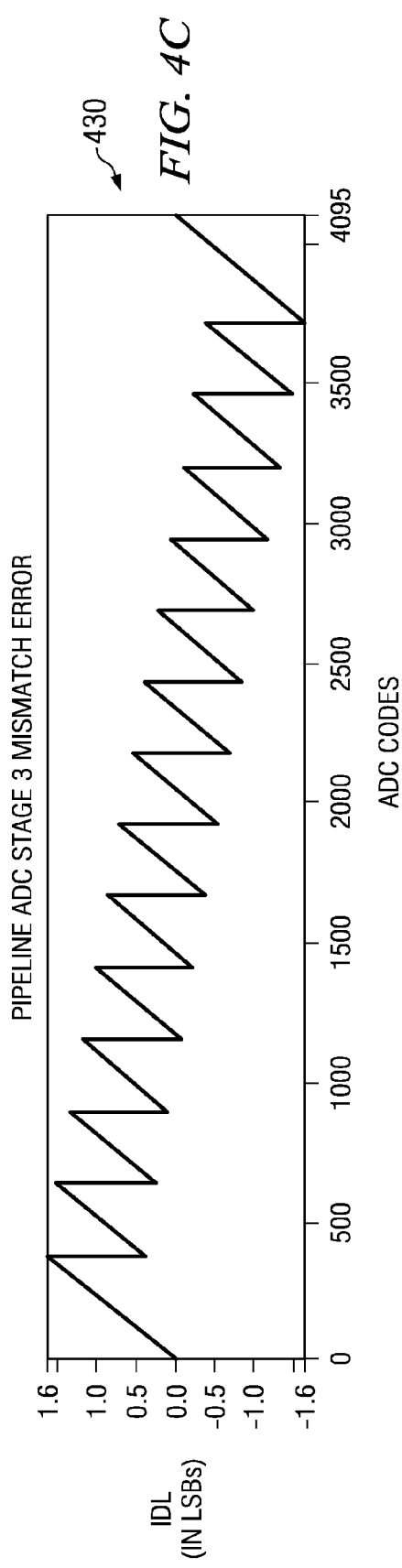
Figure 4D:
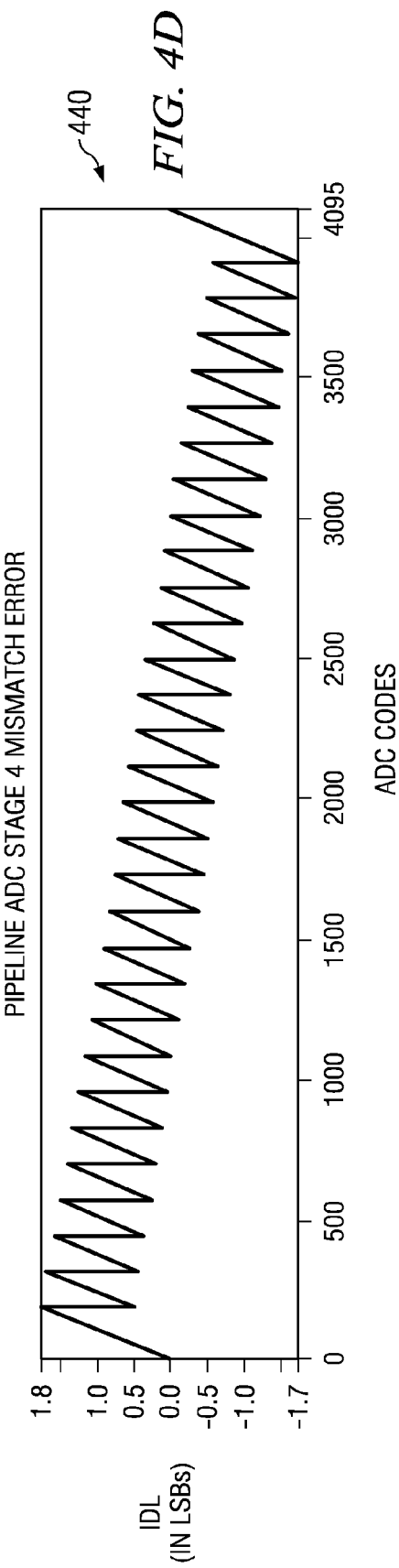

Similarly, FIGS. 4B, 4C, 4D show INL plots, generally designated 420, 430, 440, associated with second, third and fourth stage mismatch errors, respectively. The INL 420 has six major transitions at transition code locations previously discussed and varies in a range of +1.4 LSB to −1.4 LSB. Additionally, the INL 430 has 14 major transitions at transition code locations previously discussed and varies in a range of +1.6 LSB to −1.6 LSB. Finally, The INL 440 may be seen to have 30 major transitions at transition code locations previously discussed and varies in a range of +1.8 LSB to −1.7 LSB. As before, INLs 420, 430, 440 may be trimmed-out or employed to select component tolerances that significantly reduce or substantially eliminate second, third and fourth stage mismatch errors. Although not shown, fifth and sixth stage mismatch errors may be similarly addressed.

Figure 5:
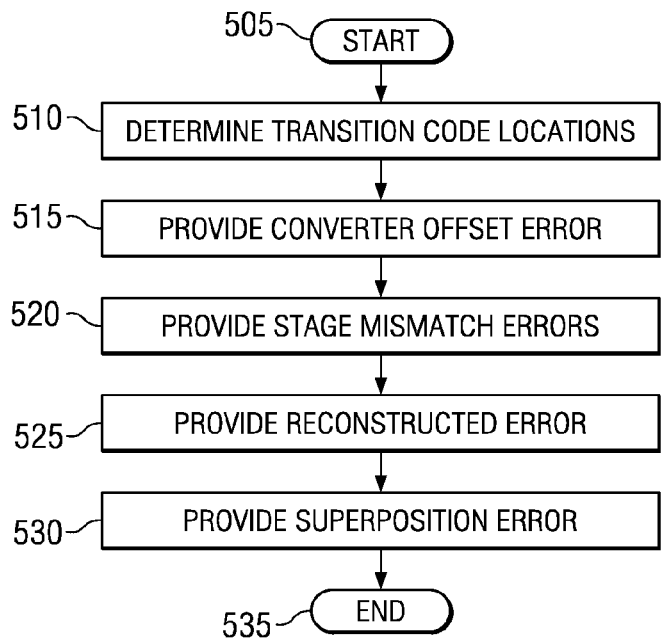
FIG. 5 illustrates a flow diagram of an embodiment of a method of compiling carried out in accordance with the principles of the present invention.

Turning now to FIG. 5, illustrated is a flow diagram of an embodiment of a method of compiling, generally designated 500, carried out in accordance with the principles of the present invention. The method 500 starts in a step 505 wherein an INL for a pipeline ADC is to be analyzed. The pipeline ADC employs a given number of ADC stages having a given number of bits per stage. In a step 510, transition locations are determined for each of the ADC stages. Determination of the transition locations employs a mathematical function based on the stages having an attribute selected from the group consisting of orthogonality and bi-state functionality.

Then, the transition code locations are used to provide a converter offset error in a step 515, and stage mismatch errors in a step 520. The stage mismatch errors in the step 520 may be the result of a capacitive mismatch, a resistive mismatch or a comparative mismatch. The converter offset error and the stage mismatch errors are then combined, in a step 525, to provide a reconstructed error. A superposition error is then provided employing the reconstructed error in a step 530. The method 500 ends in a step 535.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order and/or the grouping of the steps are not limitations of the present invention.

In summary, embodiments of the present invention employing a diagnostic compiler and a method of compiling have been presented. The diagnostic compiler and method are for use with a pipeline ADC having code sequences corresponding to its stages. The diagnostic compiler includes a transition locator that employs a mathematical function to determine transition code locations associated with each of the stages of the pipeline ADC. The diagnostic compiler also includes a characteristics indicator that provides ADC errors due to offset and stage mismatches, based on these transition code locations. These errors are typically created by component tolerances and provide major linearity error contributions at stage transition codes. A superposition error may then be determined that quantifies other errors not due to offset and stage mismatch errors.

The diagnostic compiler and method provide a testing or design capability that increases efficiency and effectiveness, since an analysis may be focused primarily on stage transition points.

Although the present invention has been described in detail, those skilled in the art should understand that they can make various changes, substitutions and alterations herein without departing from the spirit and scope of the invention in its broadest form.

What is claimed is:

1. A diagnostic compiler for use with a pipeline analog-to-digital converter (ADC) having code sequences corresponding to stages thereof, comprising:
   a transition locator configured to apply a mathematical function to determine transition locations for said code sequences based on said stages and the number of bits in respective ones of said stages of said pipeline ADC; and
   a characteristics indicator coupled to said transition locator and configured to provide at least one characteristic of said pipeline ADC based on said transition locations.

2. The diagnostic compiler as recited in claim 1 wherein said at least one characteristic is configured to represent an offset error of said ADC.

3. The diagnostic compiler as recited in claim 1 wherein said at least one characteristic is configured to represent a superposition error of said ADC.

4. The diagnostic compiler as recited in claim 1 wherein the mathematical function said transition locator is configured to apply to determine said transition locations is a Bohan function.

5. The diagnostic compiler as recited in claim 4 wherein said Bohan function is:

$$LST_m \frac{N}{2} \frac{N}{2^{m2}} j \frac{N}{2^{m1}},$$

where $LST_m$ is the location of stage transitions, m is the stage, N denotes $2^n$ for an n-bit converter and j is defined by $0 \leq j \leq 2^m - 2$.

6. The diagnostic compiler as recited in claim 1 wherein said at least one characteristic is configured to represent a stage mismatch error of said ADC.

7. The diagnostic compiler as recited in claim 6 wherein said stage mismatch error is configured to contain an attribute selected from the group consisting of:
   capacitive mismatch,
   resistive mismatch, and
   comparative mismatch.

8. A method of compiling for use with a pipeline analog-to-digital converter (ADC) having code sequences corresponding to stages thereof, comprising:

Applying a mathematical function to determine transition locations for said code sequences based on said stages and the number of bits in respective ones of said stages of said pipeline ADC; and providing at least one characteristic of said pipeline ADC based on said transition locations.

9. The method as recited in claim 8 wherein said providing at least one characteristic represents an offset error of said ADC.

10. The method as recited in claim 8 wherein said providing at least one characteristic represents a superposition error of said ADC.

11. The method as recited in claim 8 wherein said step of determining transition locations is performed by applying a Bohan function based on said stages and the number of bits in respective ones of said stages.

12. The method as recited in claim 11 wherein said Bohan function is:

$$LST_m \frac{N}{2} \frac{N}{2^{m2}} j \frac{N}{2^{m1}},$$

where $LST_m$ is the location of stage transitions, m is the stage, N denotes $2^n$ for an n-bit converter and j is defined by $0 \square j \square 2^m - 2$.

13. The method as recited in claim 8 wherein said providing at least one characteristic represents a stage mismatch error of said ADC.

14. The method as recited in claim 13 wherein said stage mismatch error contains an attribute selected from the group consisting of:
capacitive mismatch,
resistive mismatch, and
comparative mismatch.

15. A test system, comprising:
a data processing unit that has a device testing interface;
a pipeline analog-to-digital converter (ADC) that is coupled to said device testing interface and has code sequences corresponding to stages thereof; and a diagnostic compiler that is coupled to said pipeline ADC, including:

a transition locator that determines transition locations for said code sequences by applying a mathematical function based on said stages and the number of bits in respective ones of said stages of said pipeline ADC; and a characteristics indicator, coupled to said transition locator, that provides at least one characteristic of said pipeline ADC based on said transition locations.

16. The system as recited in claim 15 wherein said at least one characteristic represents an offset error of said ADC.

17. The system as recited in claim 15 wherein said at least one characteristic represents a superposition error of said ADC.

18. The system as recited in claim 15 wherein the mathematical function said transition locator employs is a Bohan function.

19. The system as recited in claim 18 wherein said Bohan function is:

$$LST_m \frac{N}{2} \frac{N}{2^{m2}} j \frac{N}{2^{m1}},$$

where $LST_m$ is the location of stage transitions, m is the stage, N denotes $2^n$ for an n-bit converter and j is defined by $0 \square j \square 2^m - 2$.

20. The system as recited in claim 15 wherein said at least one characteristic represents a stage mismatch error of said ADC.

21. The system as recited in claim 20 wherein said stage mismatch error contains an attribute selected from the group consisting of:
capacitive mismatch,
resistive mismatch, and
comparative mismatch.

* * * * *